United States Patent [19]
Garcia

[11] Patent Number: 5,984,079
[45] Date of Patent: *Nov. 16, 1999

[54] METHOD AND APPARATUS FOR LOADING ELECTRONIC COMPONENTS

[75] Inventor: Douglas J. Garcia, Valley Center, Calif.

[73] Assignee: Electro Scientific Industries, Inc., Portland, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 08/679,134

[22] Filed: Jul. 12, 1996

[51] Int. Cl.⁶ .......................... B65G 17/32; B65G 29/00; B23Q 7/12

[52] U.S. Cl. .................. 198/397.02; 198/392; 221/157; 221/168; 221/169; 221/265

[58] Field of Search .................................... 198/397, 392, 198/406; 221/157, 167, 168, 169, 265, 278; 193/48, 44

[56] References Cited

U.S. PATENT DOCUMENTS

| | | | |
|---|---|---|---|
| 2,538,706 | 1/1951 | Reynolds et al. | 198/397 |
| 3,239,059 | 3/1966 | Cole, Jr. et al. | 209/73 |
| 3,613,861 | 10/1971 | Whitecar | 198/392 |
| 3,980,553 | 9/1976 | Quinn | 209/73 |
| 3,986,636 | 10/1976 | Hoppmann et al. | 198/392 |
| 4,128,174 | 12/1978 | Frisbie et al. | 209/573 |
| 4,183,074 | 1/1980 | Wallace | 361/402 |
| 4,205,743 | 6/1980 | Whitmore | 198/393 |
| 4,301,580 | 11/1981 | Wallace | 29/25.42 |
| 4,348,714 | 9/1982 | Wallace | 361/328 |
| 4,377,891 | 3/1983 | Wallace | 29/25.42 |
| 4,381,321 | 4/1983 | Braden | 427/79 |
| 4,393,808 | 7/1983 | Braden | 118/503 |
| 4,395,184 | 7/1983 | Braden | 414/417 |
| 4,406,373 | 9/1983 | Braden | 209/574 |
| 4,418,814 | 12/1983 | Rose | 198/406 |
| 4,526,129 | 7/1985 | Braden | 118/503 |
| 4,669,416 | 6/1987 | Delgado et al. | 118/503 |
| 4,673,077 | 6/1987 | Taniguchi | 198/393 |
| 4,747,479 | 5/1988 | Herrman | 198/345 |
| 4,753,061 | 6/1988 | Braden et al. | 53/471 |
| 4,790,438 | 12/1988 | Wilhelm et al. | 209/573 |
| 4,818,382 | 4/1989 | Anderson et al. | 209/573 |
| 4,926,194 | 5/1990 | Herrmann | 346/108 |
| 4,979,607 | 12/1990 | Fogg | 198/392 |
| 5,034,749 | 7/1991 | Jungblut et al. | 324/158 |
| 5,044,872 | 9/1991 | Hunt et al. | 414/786 |
| 5,057,772 | 10/1991 | Bruno et al. | 324/158 |
| 5,060,782 | 10/1991 | Marti | 198/397 |
| 5,205,395 | 4/1993 | Bruno et al. | 196/389 |
| 5,337,893 | 8/1994 | Nami et al. | 206/329 |
| 5,536,138 | 7/1996 | Garcia | 414/799 |
| 5,570,812 | 11/1996 | Ando et al. | 221/233 |

OTHER PUBLICATIONS

Metreaud, C.G. *Article Handling System*, IBM Technical Disclosures Bulletin, vol. 9, No. 7, Dec. 1996, pp. 953–954.

*Primary Examiner*—William E. Terrell
*Assistant Examiner*—Joe Dillon, Jr.
*Attorney, Agent, or Firm*—Stoel Rives LLP

[57] ABSTRACT

A method and an apparatus for loading and positioning of elongate terminated electronic components include a load plate having vertical slots extending therethrough, the slots being spaced apart at regular intervals and each slot having parallel opposing sidewalls. Components are positioned and retained in the load plate slots with the long axes of the components in an orientation transverse to the upper surface of the load plate. At a predetermined time, each component is allowed to drop out of the slot and through a curved chute, the chute bending from an upper opening to a medial point and flaring outwardly from the medial point to a lower opening, and having a width at the medial point larger than the short axis of the component and a width at the lower opening slightly larger than the long axis of the component so that the component is rotated through about 90° on passage through the chute. As the component exits the bottom of the chute, it enters and is retained in a shallow rectangular pocket in a test plate. Because of the 90° rotation, the long axis of the component is oriented generally parallel to the upper surface of the test plate and is thus making the component available for testing and processing by conventional means.

22 Claims, 10 Drawing Sheets

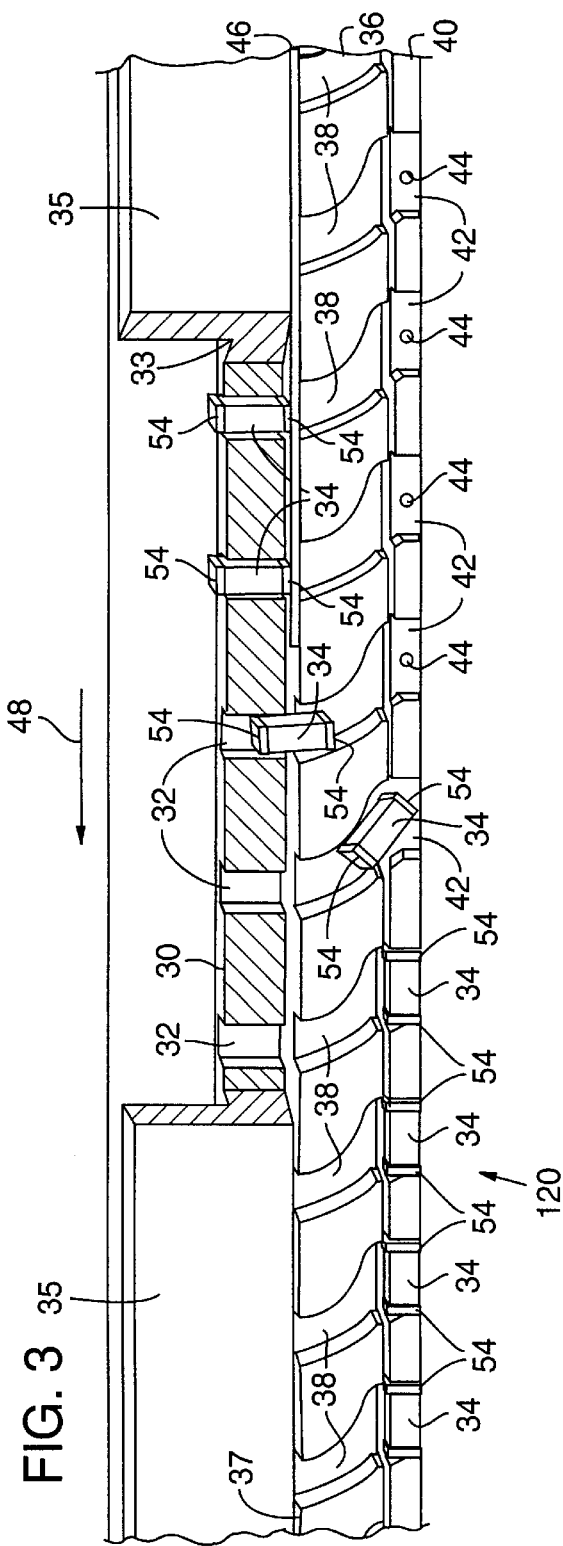

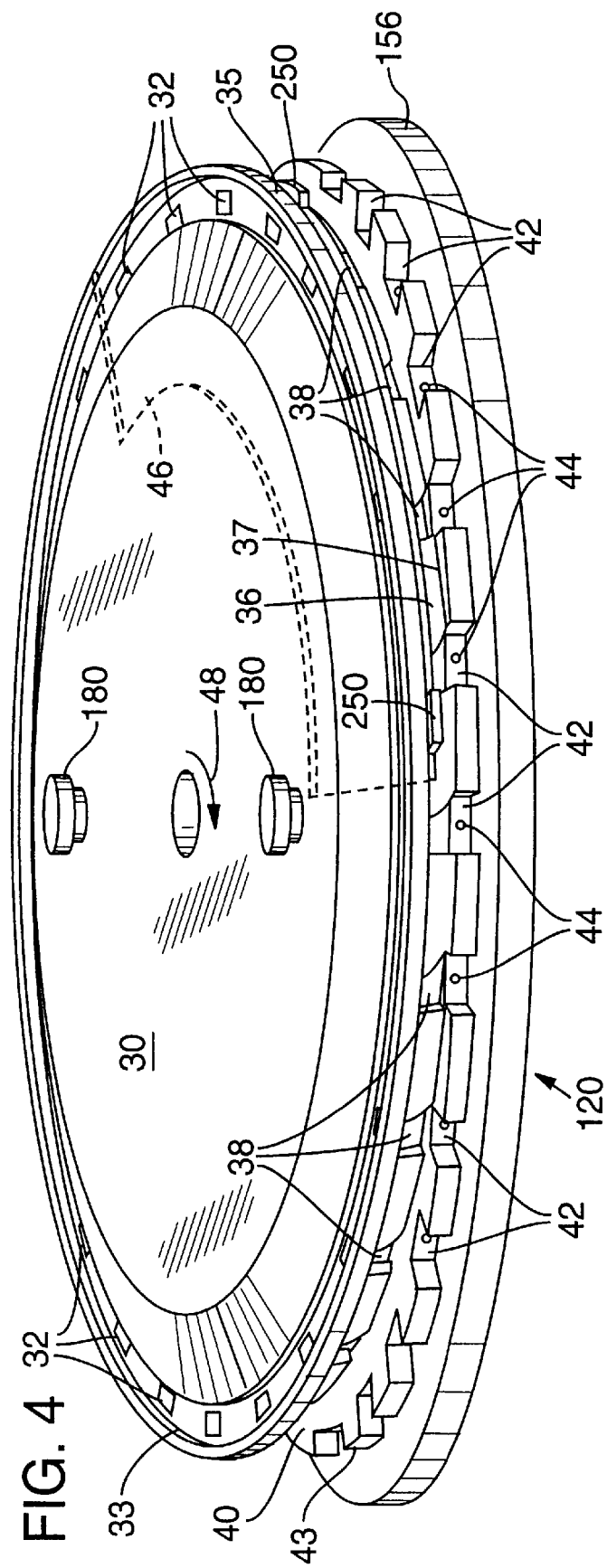

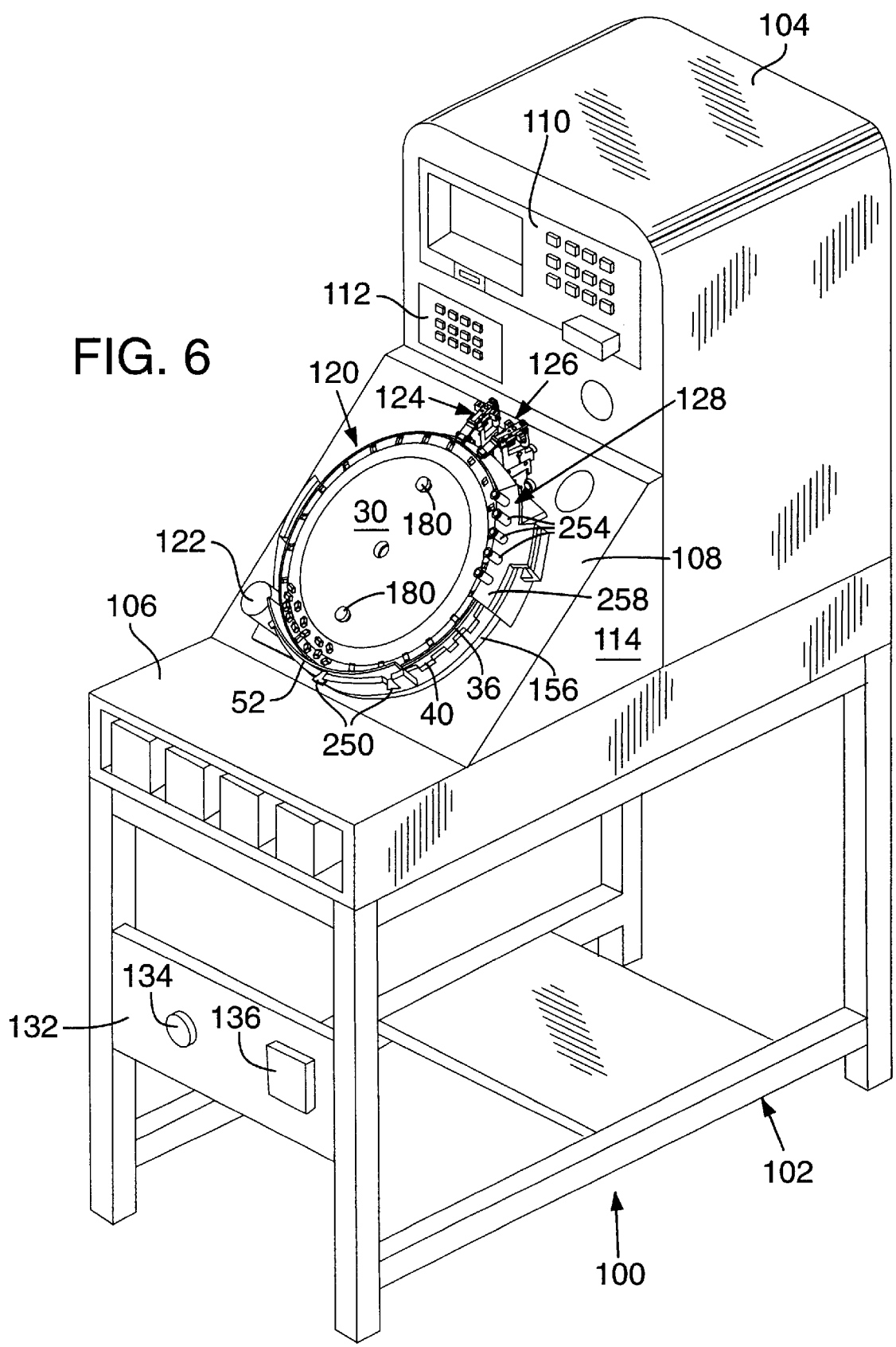

METHOD AND APPARATUS FOR LOADING ELECTRONIC COMPONENTS

TECHNICAL FIELD

The present invention relates to loading and is positioning of miniature electronic components for testing and other operations. In particular, the present invention relates to methods and apparatus for loading and positioning multiple electronic components each of which having unequal length and width dimensions.

BACKGROUND OF THE INVENTION

Methods for rapidly testing and sorting large quantities of miniature electronic components, such as chip capacitors and resistors, are well known in the art. For example, U.S. Pat. No. 4,406,373, assigned to the assignee of the present application, teaches a method in which components to be tested are arranged in banks of rows and files on a test plate. The test plate is advanced past a testing station where an electrical property of the component is tested by contacting each component with an electrical probe. The components are subsequently passed to a sorting station where each component is blown out of the test plate and into one of several receptacles depending on the determined electrical property of the component. Components to be tested may be loaded either directly into the test plate or first placed in a load plate and then transferred to the test plate.

More recently, automated rotary testers, such as the Palomar Systems, Inc. Model 18 tester (Escondido, Calif.), have been developed that can test large quantities of components at high speeds. In these testers, components to be tested and sorted are placed in slots, or holes, spaced apart on the outer circumference of a circular test plate. The test plate is rotated in a stepwise, intermittent manner towards a testing station where one or more electrical properties of the components are determined by means of electrical probes. The test plate then advances to a sorting station where the components are directed into one of several receptacles depending on the determined electrical property.

When electronic components having nearly equal length and width dimensions are tested in either linear or rotary test devices as described above, the components may be positioned in the test plate, either directly or indirectly by means of a load plate, using vibratory and/or vacuum techniques well known in the art. For example, the Palomar Systems, Inc. Model 18 rotary tester includes a rearwardly inclined circular test plate that may be loaded by simply depositing a multiplicity of components on the lower front portion of the test plate, either manually or by an automatic feed mechanism. The stepwise rotation of the test plate agitates the components sufficiently to cause them to fall into the slots on the outer circumference of the test plate.

However, these loading techniques cannot be successfully employed for electronic components of which one of the length and width dimensions is greater than the other, hereinafter referred to as elongate, terminated components. Industry practitioners define for a miniature electronic component the length as the distance between the end caps (i.e., coated ends) of the component, the thickness as the height of the internal stack of ceramic and metal layers, and the width as the remaining dimension. FIGS. 1A, 1B, and 1C show, respectively, long-side terminated, short-side terminated, and chip array components as examples of elongate, terminated components. Each of these components has an elongate rectangular body 2 and multiple electrically conductive coatings 4 that form the terminals. (The features of the individual components are identified by the suffix of the corresponding figure number.)

The difficulty associated with loading elongate, terminated devices is illustrated by FIG. 1D for short-side terminated components of the type shown in FIG. 1B. To accommodate such components, slots 6 in a test plate 8 must necessarily be wider than the smallest dimension of the components. When they enter test plate slots 6, short-side terminated components tend to stand upright, thereby resulting in a significant percentage of components standing at a 90° misaligned orientation in test plate slots 6 and remaining incorrectly positioned. Moreover, a short-side terminated component such as an 0612 body, which is 0.06 inch (1.5 mm) long and 0.12 inch (3.0 mm) wide, necessitates a 0.13 inch (3.3 mm) wide test plate slot 6 that would undesirably accommodate two incorrectly loaded 0612 components standing side-by-side in one slot, as shown in FIG. 1D.

A method commonly employed for loading elongate, terminated components is the flat-load technique. As shown in FIG. 2A, short-side terminated components 10 are first placed manually in a series of shallow pockets 12 in a flat-load plate 14, with the terminals 16 of components 10 oriented towards the short sides of pockets 12. A thin slide plate 18, typically made of stainless steel, is placed between flat-load plate 14 and a slotted test plate assembly 20. Test plate assembly 20 includes a two-piece electrically nonconductive top plate 21 having slots 22 chamfered at one end and of uniform width at the other end, and a common plate 23 having a copper plated surface 24 and smaller diameter slots 26 axially aligned with corresponding slots 22 in top plate 21. The long sides of pockets 12 are generally perpendicular to the longitudinal axes of slots 22 and 26. Slide plate 18 covers pockets 12 of flat-load plate 14 to hold components 10 in place. The assembled stack of plates is inverted, as shown in FIG. 2B, and slide plate 18 is removed, thereby allowing components 10 to fall into slots 22 of test plate assembly 20 and against surface 24 of common plate 23, as shown in FIG. 2B. As shown in FIG. 2C, with flat-load plate 14 and the chamfered slot piece of top plate 21 removed, a common voltage or electrical current is then applied to copper surface 24 of common plate 23, with which bottom terminals 16b of components 10 are in contact. An electrical probe 28 is then applied against the top terminal 16t of each component 10 to measure its electrical properties.

Manual loading and flat loading are operator intensive and do not readily facilitate rapid testing of large quantities of components. There thus remains a need in the art for a method and an apparatus that permit rapid loading and positioning of large quantities of elongate, terminated electronic components for testing and processing operations.

SUMMARY OF THE INVENTION

An object of the present invention is to provide a method and an apparatus for loading and positioning electronic components, in particular elongate, terminated components, for testing and other operations to improve efficiency of such operations.

Another object of the present invention is to ensure proper orientation of elongate, terminated components in the slots of a test plate.

A further object of the present invention is to solve the problem of loading more than one component into a single slot of a test plate. This problem is particularly common when the length dimension of the electronic component is less than about 60% of the width dimension.

Still another object of the present invention is to provide for loading and positioning elongate, terminated components a method and an apparatus that can be used in conjunction with existing techniques and devices employed in testing and processing operations.

These and other objects are achieved according to the methods and apparatus of the present invention by loading elongate, terminated components upright in a load plate, a position such components are naturally predisposed to assume, and then turning them to a desired orientation in a test plate for electrical testing. The invention is implemented by providing a load plate having vertical slots or holes extending through the plate and being spaced apart at regular intervals, each slot having parallel opposing sidewalls. Preferably, the slots are slightly wider (e.g., 0.005 inch (0.13 mm) for a 0612 component) than the length and slightly wider (e.g., 0.005 inch (0.13 mm) for a 0612 component) than the width of the elongate, terminated components to be loaded.

Most of the components are positioned to stand upright in the load plate slots, using methods known in the art. At a predetermined time, the component is allowed to drop out of the slot and through a curved chute. Each chute bends gradually from its upper opening to a medial point and flares outwardly from the medial point to its lower opening. The chute has at the medial point a width slightly larger than the short dimension of the component and a width at the lower opening slightly larger than the long dimension of the component so that, on passage through the chute, the component is rotated through an angle of about 90°. As it exits the bottom of the chute, the component enters and is retained in a shallow, rectangular pocket in a test plate. Because of the approximate 90° rotation, the terminals of the component coated on the ends of its long dimension are oriented parallel to the upper surface of the test plate and are thus available for testing or processing by conventional means.

The chutes of the present invention may be an is integral part of the load plate or, preferably, are formed within a third plate, hereinafter referred to as the chute plate, with the chutes being spaced apart at the same interval as, and in correspondence with, the slots of the load plate. The chute plate is positioned directly below and parallel to the lower surface of the load plate.

When a separate chute plate is employed, a stationary thin film plate in the shape of a 120° angular segment is preferably positioned between the lower surface of the load plate and the upper surface of the chute plate to retain the components in the slots. A drive mechanism rotates the load plate, chute plate, and test plate as a unit so that components loaded in the load plate slots travel past the film plate and fall out of the load plate slots, through the corresponding chutes, and into the pockets in the test plate. The components are retained in the test plate pockets by application of vacuum pressure or by an optional base plate that is placed immediately below the test plate to enclose the lower end of the test plate pockets.

In a preferred embodiment, the load plate, chute plate, and test plate of the present invention are circular and the load plate slots, chutes, and test plate pockets are positioned along the outer circumference of the load plate, chute plate, and test plate, respectively. All three plates rotate continually in the same direction and at the same rate; however, the test plate rotates at an angle with respect to the loading plate and the chute plate. The upper surface of the test plate is thereby positioned in closest proximity to the bottom surface of the chute plate near the point of transfer of the component from the chute to the pocket of the test plate but gradually becomes farther away from the lower surface of the chute plate as rotation continues. As the gap thus formed increases, sufficient clearance is attained between the test plate and the chute and load plates to permit easy access to the terminals of the component for testing and other operations. When the component is retained in the pocket by means of vacuum pressure, the lower side of the component is also accessible for direct testing. The present invention can thus be employed for rapid testing and sorting of large quantities of electronic components with minimal operator involvement.

The test plate can be slightly thinner than the short dimension of the components to be tested. Similarly, the depth of the test plate pockets may be smaller than the short dimension of the components. The ability to provide protrusion of the upper, lower, and/or exterior surfaces of the components facilitates their testing and processing. For example, design of electrical test probes for contacting component terminals is simplified, frictional or mechanical positioning and gripping of the component is facilitated, and four-terminal testing is made possible.

The above-mentioned and additional features of the present invention and the manner of obtaining them will become apparent, and the invention will be best understood by reference to the following more detailed description, read in conjunction with the accompanying drawings.

BRIEF DESCRIPTION OF THE DRAWINGS

FIG. 3 is a cross-section of a preferred embodiment of a load plate, chute plate, and test plate of the present invention.

FIG. 4 is a perspective view of the load plate, chute plate, and test plate of FIG. 3.

FIG. 5 is an exploded, isometric view of the load plate, chute plate, and test plate of FIGS. 3 and 4.

FIG. 6 is a front isometric pictorial view of an automated rotary tester in which the present invention may be implemented.

DETAILED DESCRIPTION OF PREFERRED EMBODIMENTS

Figure 1A:
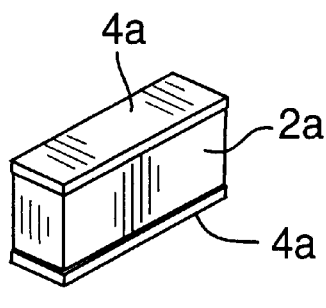
FIGS. 1A, 1B, and 1C show, respectively, long-side terminated, short-side terminated, and chip array components.
Figure 1B:
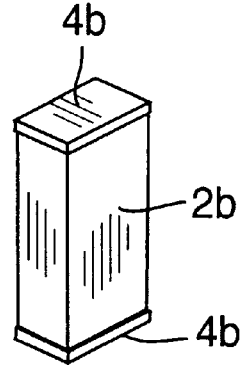

Electronic components that may be effectively loaded and positioned using the methods and apparatus of the present invention include electronic components, such as surface mount capacitors, in which one of its length and width dimensions is greater than the other. Such components are commonly referred to as elongate, terminated components and include component body sizes designated as 0508, 0612, 1316, 1825 and 2225. Multiterminal, or networked component packages, also typically fall into this geometrical category.

A preferred embodiment of the present invention is illustrated in FIGS. 3–5. A circular load plate 30 is provided with multiple slots 32 spaced apart at regular intervals around its outer circumference 33, each slot 32 being sized to receive an electronic component 34 oriented to stand upright with its long, or length, axis transversely of and typically approximately perpendicular to the surface of load plate 30. A preferred load plate 30 has an 11.1 inch (38.2 cm) diameter and 0.013 inch (0.33 mm) edge thickness, and next adjacent slots spaced apart by 3°. For a 0.035 inch (0.89 mm) thick 0612 component 34, slots 32 are 0.085 inch (2.16 mm) long and 0.05 inch (1.27 mm) deep. Load plate 30 is formed of a nonflexible material, such as a G-10 epoxy glass and other well-known materials that are abrasion resistant and dimensionally stable. Outer circumference 33 of load plate 30 may be surrounded by a circumferential wall 35 extending perpendicularly upwards from load plate 30.

A chute plate 36, having the same diameter as that of load plate 30, is positioned immediately below and parallel to load plate 30, so that outer circumference 37 of chute plate 36 is in direct correspondence with outer circumference 33 of load plate 30. Multiple curved chutes 38 are provided along outer circumference 37 of chute plate 36 with each chute 38 being in communication with a slot 32 of load plate 30. Chute 38 has a nearly constant cross sectional area and bends gradually from its upper opening to a medial point, where chute 38 then flares outwardly from the medial point to its lower opening. Chute 38 has at the medial point a width slightly larger than the short-width axis of component 34 and a width at the lower opening slightly larger than the long-length axis of component 34. The long axis of component 34 is thus rotated during its passage through chute 38, thereby orienting the long axis, or length dimension, of component 34 parallel to he lower surface of chute plate 36. The size and precise dimensions of chute 38, and therefore the depth of chute plate 36, vary with the dimensions of the components to be tested. Chute plate 36 is preferably formed of a smooth, nonstatic material, such as nickel-plated steel. Skilled persons will appreciate that had it been coated along its long axis, component 34 would have been rotated to orient its width dimension parallel to the lower surface of chute plate 36.

A test plate 40 also has the same diameter as that of load plate 30 and is provided with shallow pockets 42 spaced apart around its circumference 43 at the same interval as slots 32 are spaced apart around the circumference of load plate 30. Test plate 40 can be formed of any non-electrically conductive material, such as G-10 epoxy gloss, employed in the art for the construction of test plates. Each pocket 42 is sized to receive a component 34 with its long axis oriented parallel to the surfaces of test plate 40. Thus, the long axis of component 34 is angularly displaced from an initial transverse orientation relative to the surfaces of test plate 40 to the parallel orientation in pocket 42 of test plate 40. Pocket 42 preferably has a depth that is less than the width of component 34 so that it protrudes from pocket 42 for easy access. A vacuum pressure passageway 44 may be provided in a sidewall of pocket 42 to permit application of vacuum pressure to retain component 34 in pocket 42.

A stationary thin film plate 46 in the shape of a 120° angular segment is preferably positioned between the lower surface of load plate 30 and the upper surface of chute plate 36 to retain components 34 in slots 32. Film plate 46 is preferably made of 0.01 inch (0.25 mm) stainless steel shim stock to have a 4.0 inch (10.2 cm) inner radius and a 5.5 inch (14.0 cm) outer radius so that film plate 46 extends 0.5 inch (12.7 mm) outside and 1.0 inch (25.4 mm) inside of the diameter of load plate 30. Film plate 46 is secured along the outer radial edge of the circumference of load plate 30. Once they are correctly aligned, load plate 30, chute plate 36, and test plate 40 in operation rotate together as a unit so that components 34 loaded in slots 32 travel past film plate 46 and fall out of slots 32 through chutes 38 and into pockets 42.

Load plate 30, chute plate 36, and test plate 40 are continually rotated in the same clockwise direction 48 and at the same speed, with test plate 40 preferably oriented in a rearwardly inclined plane. Load plate 30 and chute plate 36 rotate in a plane that is disposed at an angle of preferably about 4° with respect to test plate 40. The upper surface of test plate 40 and the lower surface of chute plate 36 have a closest point of separation at the lower edge of the plane of rotation in the eight o'clock position and gradually separate from each other at greater distances as rotation continues, thus providing Sufficient clearance between test plate 40 and chute plate 36 to provide access for electrical testing of components 34 positioned in test plate 40. Film plate 46 preferably extends between approximately the four o'clock and eight o'clock positions of the lower surface of load plate 30. A stationary thin wall 50 supported by an angular support segment 52 (FIGS. 6 and 7) is located adjacent load plate outer circumference 33 and oriented perpendicular to the upper surface of load plate 30 in the area where components 34 are loaded.

In operation, components 34 to be positioned in slots 32 of load plate 30 are placed on the upper surface of load plate 30 at the lower edge of the plane of rotation, i.e. Between about the five o'clock and six o'clock positions of load plate 30. As load plate 30 is rotated, most of components 34 fall into slots 32 and stand upright in a position perpendicular to the upper surface of load plate 30, with terminals 54 at either end of components 34 oriented perpendicular to the two opposing sidewalls of slots 32, where they are retained by gravity and film plate 46. To prevent unloaded components from being carried on the upper surface of load plate 30 during rotation, a pulsed air jet (not shown) is applied to the components in a direction opposite that of rotation, thereby retaining unloaded components at about the six o'clock position of load plate 30. The air jet typically provides air pressure of between about 5 psi to about 10 psi at a rate of about 100 to about 200 pulses/sec and may comprise a copper pipe of about 0.063 inch (0.16 cm) diameter.

As load plate 30 rotates, loaded components 34 are moved away from the location of film plate 46 and are thus able to fall out of slots 32 and through chutes 38 in chute plate 36. Components 34 passing through chutes 38 rotate through angles that cause their long axes to lie parallel to the surfaces of test plate 40. Components 34 drop into pockets 42 in test plate 40, where they are retained by means of vacuum pressure applied through passageway 44 by a vacuum pressure source (not shown). Vacuum pressure is preferably applied after a component 34 just loaded into a pocket 42 is rotated about four pocket positions to allow time for component 34 to assume correct alignment in pocket 42. As rotation continues, the distance between the upper surface of test plate 40 and the lower surface of chute plate 36 increases sufficiently to permit access to the upper and lower surfaces of components 34 for testing and processing operations.

The apparatus and methods of the present invention may be usefully employed with devices known in the art for rapid testing and processing of bulk quantities of electronic components, such as automated rotary testers. FIGS. 6–12 show a suitable rotary tester 100, the design of which is based on that of the Palomar Systems, Inc. Model 18 rotary tester (Escondido, Calif.).

Figure 11:
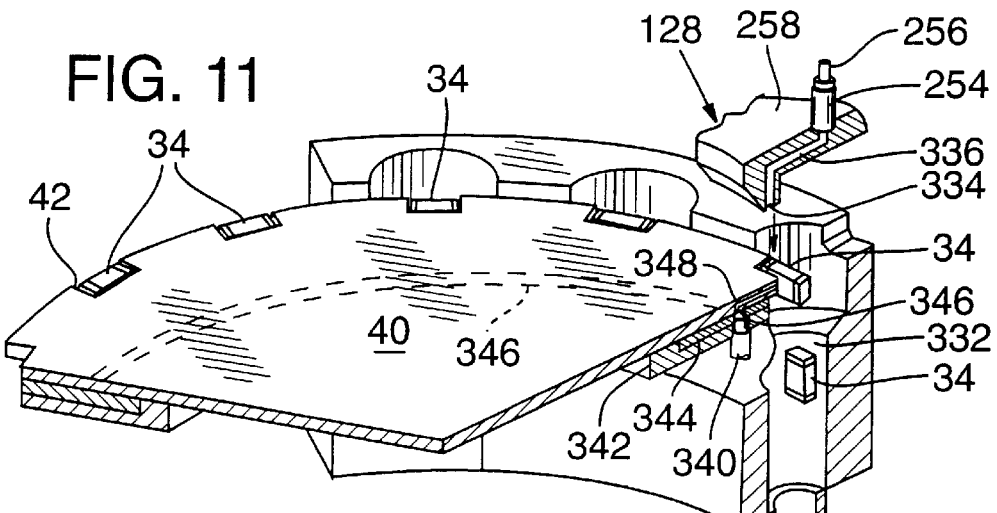
FIG. 11 is a fragmentary isometric view showing the manner in which electronic components are sorted after testing and the flow path of ejection pressure that ejects the components from pockets in the test plate.

FIG. 6 is an isometric pictorial view of rotary tester 100 supported on a test stand 102. With reference to FIG. 6, tester 100 includes an electronics enclosure 104 positioned upright at the rear end of a top surface 106 of test stand 102 and a rearwardly inclined fixture plate 108 extending from an intermediate point on the electronics enclosure 104 to top surface 106 of test stand 102. Electronics enclosure 104 houses an electrical parameter (e.g., resistance, inductance, and capacitance) test measurement instrument 110 and an operational control panel 112. Fixture plate 108 is supported by sidewalls 114 (only one shown) and provides the mounting surface for a rotatable assembly 120 composed of load plate 30, chute plate 36, and test plate 40. An electric stepper motor 122 is mechanically coupled to rotate assembly 120 to load electronic components 34 in the proper orientation for testing at test heads 124 and 126 and then discharge by means of an air blow off manifold 128 to a component collection bin 130 (FIG. 11). The provision of two test heads 124 and 126 enables performance of different electrical tests on the same component 34 or the same electrical test with different degrees of precision. Test heads 124 and 126 and blow off manifold 128 are angularly spaced apart around the periphery of rotatable assembly 120. Electronics enclosure 104 also houses a microprocessor-based controller (not shown) that coordinates the movement of rotatable assembly 120, functions of test heads 124 and 126, operation of air delivery through blow off manifold 128, and other system functions.

An instrument panel 132 positioned between the two front legs of test stand 102 supports a vacuum pressure sensor 134 and vacuum gauge 136 that provide redundant monitoring of externally supplied vacuum pressure to tester 100 to hold the properly oriented components 34 in pockets 42 of test plate 40 preparatory to testing.

Figure 7:
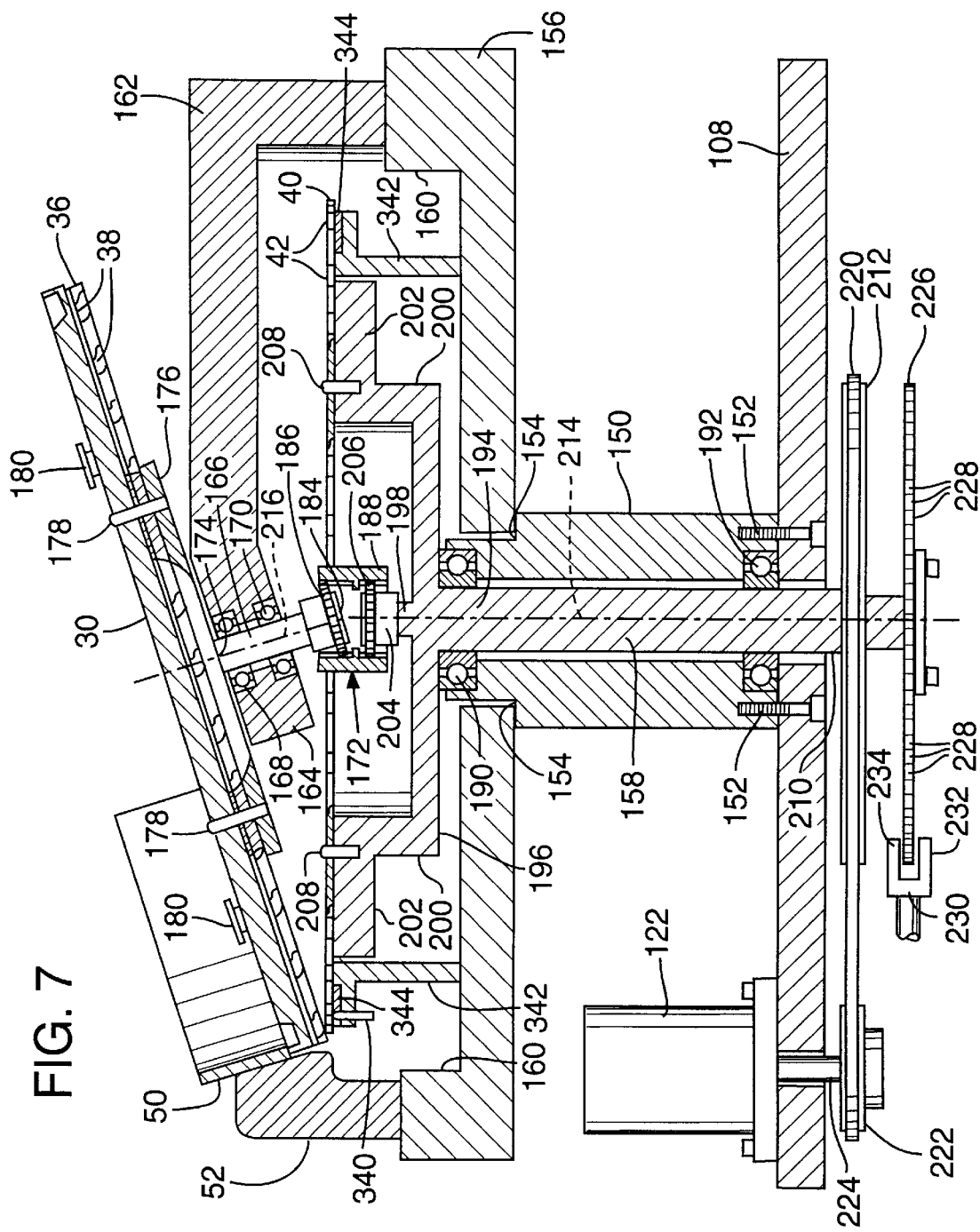
FIG. 7 is a cross-sectional side elevation view of the mounting and rotation control mechanisms of the rotary tester of FIG. 6, with the test heads and blow off manifold removed for clarity.

FIG. 7 is a fragmentary cross-sectional side elevation view of rotary tester 100 showing the mounting and rotation control mechanisms for rotatable assembly 120. With reference to FIG. 7, one end of a hollow sleeve 150 is secured by screws 152 to and extends perpendicularly from fixture plate 108. The other end of sleeve 150 has Et shoulder 154 that supports a circular base plate 156. A rotatable main drive shaft 158 extends through sleeve 150 and fixture plate 108.

Base plate 156 has a circumferential wall 160 to which a stationary angle arm 162 is mounted. Angle arm 162 supports near its downwardly inclined free end 164 an angle drive shaft 166 that 4S journaled for rotation by spaced-apart bearings 168 and 170 installed in angle arm 162. Angle drive shaft 166 constitutes a component of a flexible shaft drive coupling 172 available from KTR Corporation, Michigan City, Ind. as part number M-28. Angle drive shaft 166 has an upper end 174 to which a top mounting plate 176 is secured.

Mounting plate 176 has two dowel pins 178 that pass through load plate 30 and chute plate 36 so that they rotate together with their corresponding slots 32 and chutes 38 in alignment as angle drive shaft 166 rotates. A pair of hand knobs 180 projecting outwardly from the front face of load plate 30 facilitate the installation and removal of load plate 30, chute plate 36, and mounting plate 176. Angle drive shaft 166 has a lower end 184 that terminates in a gear 186 positioned within a housing 188 of shaft drive coupling 172.

Main drive shaft 158 is journaled for rotation by spaced-apart bearings 190 and 192 installed within sleeve 150. Main drive shaft 158 has an upper end 194 that carries a top plate 196 through which a center stub 198 extends and on which a circumferential wall 200 supports an angular flange 202. Center stub 198 fits within a drive cup 204 of shaft drive coupling 172 to impart rotational motion to a gear 206 position within housing 188. Test plate 40 is secured to flange 202 by dowel pins 208 so that test plate 40 and fixture plate 108 are plane parallel to each other. Main drive shaft 158 has a lower end 210 that extends into and is turned by a drive pulley 212. Thus, when drive pulley 212 turns main drive shaft 158. test plate 40 rotates about an axis 214 in a plane parallel to that of fixture plate 108, and chute plate 36 and load plate 30 together rotate about an axis 216.

Although test plate 40, chute plate 36, and load plate 30 rotate in unison, axes 214 and 216 of rotation are angularly displaced by the operation of shaft drive coupling 172, whose angular offset of preferably about 4° and is equal to the angular inclination of free end 164 of angle arm 162. The angular displacement of axes 214 and 216 in cooperation with the rearward inclination of fixture plate 138 permits gravity-assisted initial loading of electronic components 34 into slots 32 of load plate 30 near the point where all three plates are closest together. The angular displacement of axes 214 and 216 permits the subsequent testing of electronic components 34 positioned in packets 42 of test plate 40 near the point where test plate 40 is farthest from chute plate 36 and load plate 30.

Rotatable assembly 120 is indexed rotationally so that each pocket 42 of test plate 40 is stopped precisely in registry with test heads 124 and 126. Drive pulley 212 is mechanically coupled by an endless belt 220 to a pulley 222 mounted on an output shaft 224 of electric stepper motor 122, which is mounted on fixture plate 108. Main drive shaft 158 also mounts a circular indexing plate 226. Indexing plate 226 is provided adjacent its circumferential edge preferably with the same number of openings 228 as there are slots 32 in load plate 30. Skilled persons will appreciate that encoder plate 226 need not have the same number of openings 228 as load plate slots 32. For example, an encoder plate 226 having half as many openings 228 as load plate slots 32 would check the load plate position of every other index move.

Registering with each indexing plate opening 228 during rotation of indexing plate 226 is a photoelectric control unit 230. A light source 232 of unit 230, preferably a light emitting diode, is located on one side of indexing plate 226, and a light detector 234 is located on the opposite side of indexing plate 226. Thus, when indexing plate 226 is rotated until one of the openings 228 registers with photoelectric control unit 230, light emitted by source 232 passes through opening 228 and is sensed by detector 234. Detector 234 is thereby activated to open the electrical circuit of stepper motor 122 to stop test plate 40, so that pockets 42 register in precise alignment with test heads 124 and 126.

Figure 8:
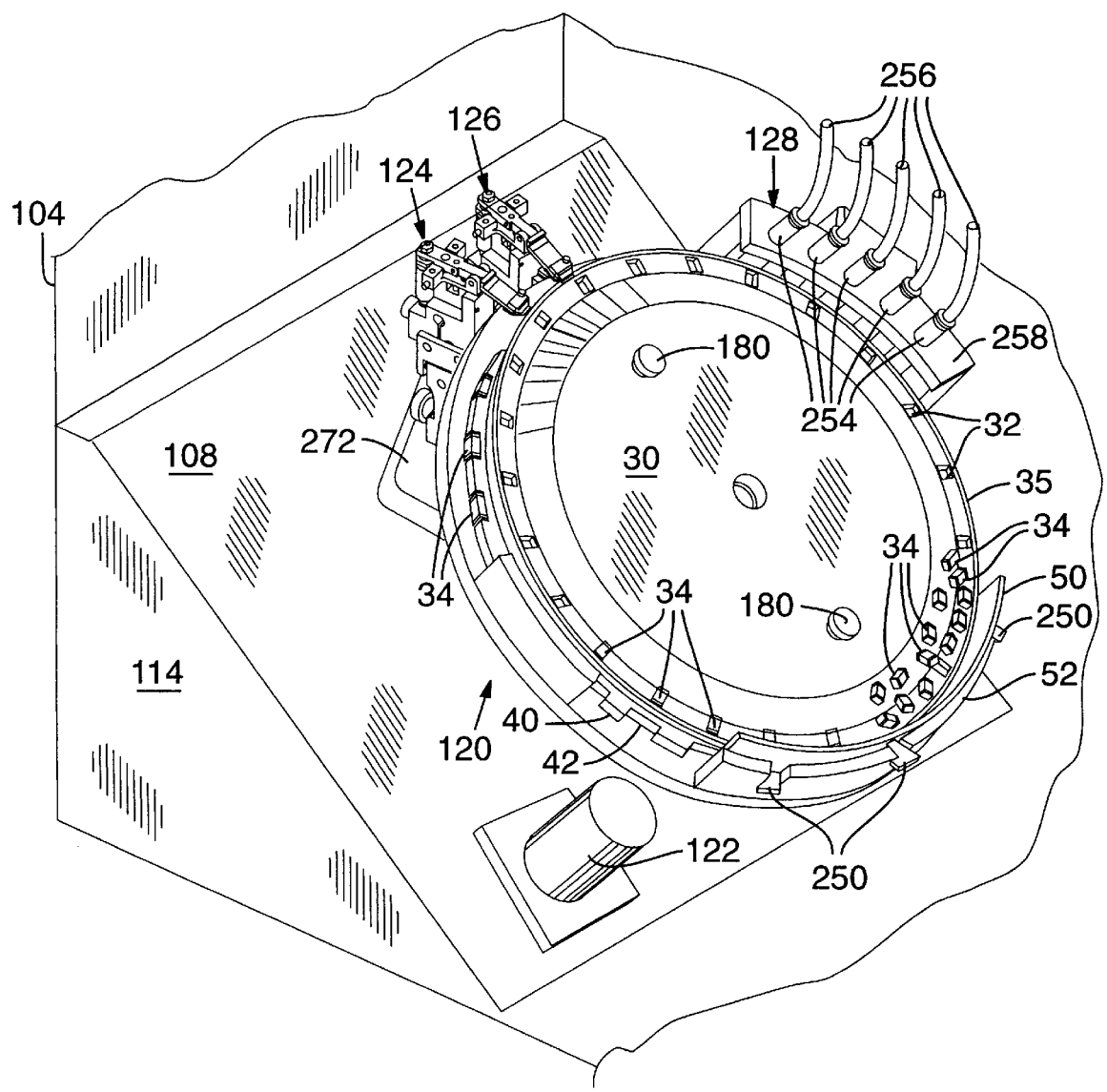
FIG. 8 is an enlarged fragmentary front view of components mounted to the fixture plate of the rotary tester of FIG. 6.

FIG. 8 shows the relative angular placement of test heads 124 and 126 and blow off manifold 128 around the circumference of rotatable assembly 120 on fixture plate 108. With reference to FIG. 8, test heads 124 and 126 are mounted on fixture plate 108 at about the twelve o'clock position of test plate 40, where there is sufficient clearance between it and chute plate 36 for access to the terminals of components 34 occupying test plate pockets 4L2. Film plate 46 has three angularly spaced-apart tabs 250 that fit into slots 252 in stationary thin wall 50 that keep film plate 46 stationary between the four o'clock and eight o'clock positions as rotatable assembly 120 rotates.

Blow off manifold 128 is mounted on fixture plate 108 between about the one o'clock and three o'clock positions of test plate 40. Flexible air tubes 256 (FIG. 11) fit over five air fittings 254 that are angularly spaced-apart around and supported on a blow off nozzle bar 258. Air fittings 254 are aligned with different consecutive pocKets 42 in test plate 40 to deliver, upon completion of electrical testing, an air blast that overcomes the vacuum pressure force holding a component 34 in a pocket 42. The values of the electrical parameter measured dictates by means of the controller which one of air fittings 254 delivers an air blast to a component 34 occupying a corresponding pocket 42.

Figure 9:
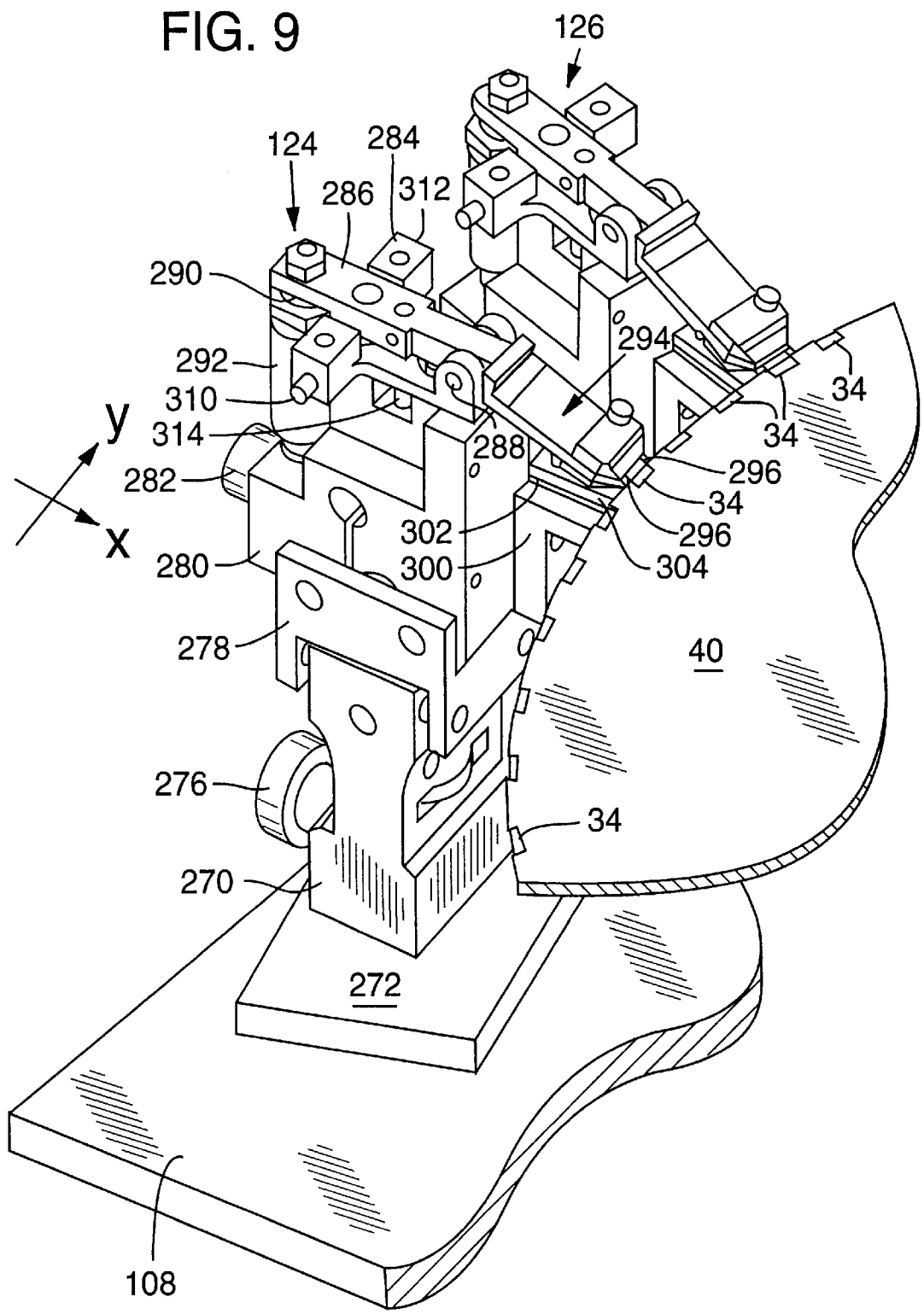
FIG. 9 is a fragmentary isometric view of the test heads of the automated rotary tester of FIG. 6.
Figure 10:
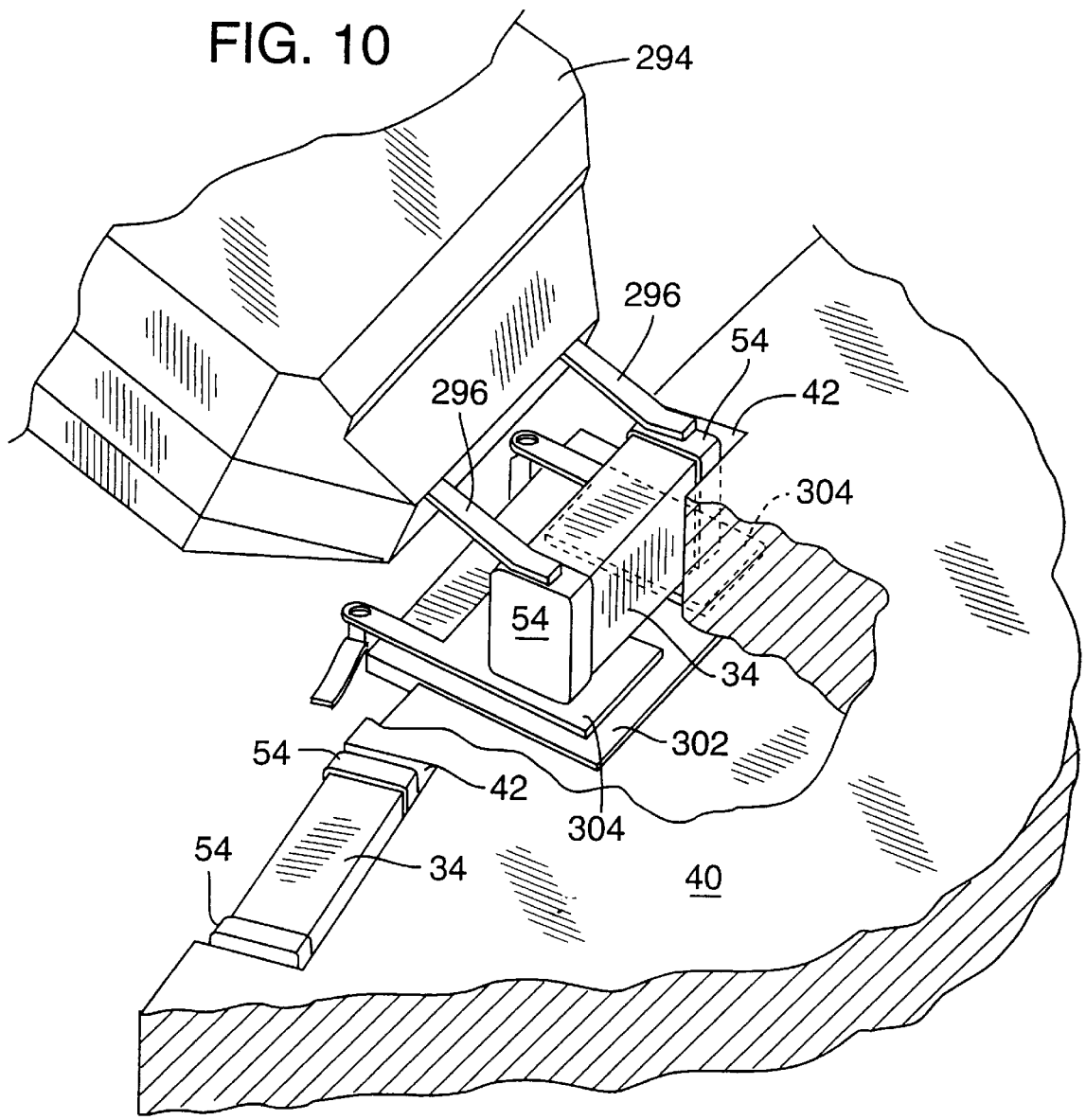
FIG. 10 is an enlarged isometric view of one of the test heads positioned to perform a four-terminal test on an electronic component carried in a test plate as shown in FIG. 9.

As was described above, test plate 40 is provided with a multiplicity of spaced-apart pockets 42 along its outer circumference. FIG. 9 shows the construction and design details of test heads 124 and 126 contacting electronic components 34 occupying pockets 42 of test plate 40, and FIG. 10 shows test head 124 in position during four-terminal testing of one of electronic components 34. Because test heads 124 and 126 are of similar construction, the following description is presented with reference only to test head 124.

With reference to FIGS. 9 and 10, test head 124 includes a base section 270 supported on a test station base plate 272 that is bolted to fixture plate 108. A positioning knob 276 engages a rod (not shown) extending through base plate 272 and base section 270 to releasably clamp base section 270 in the desired position on fixture plate 108 in relation to test plate 40. A Y-axis positioning block 278 is slidably positioned on guides (not shown) in base section 270, and an X-axis positioning block 280 is slidably positioned on guides (not shown) in Y-axis positioning block 278. Positioning block 278 moves along a Y-axis direction in response to manual operation of a positioning knob (not shown), and positioning block 280 moves along an X-axis direction in response to manual operation of a positioning knob 282. The above-described features of test head 124 are similar to those of the test heads installed in the Palomar Systems Model 18 rotary tester.

X-axis positioning block 280 carries a yoke 284 to which a rocker arm 286 is mounted for pivotal movement about a pivot p:n 288. One end of rocker arm 286 is bolted to a plunger 290 extending from a solenoid 292 mounted to X-axis positioning block 280. The other end of rocker arm 286 carries a contact station 294 from which two spaced-apart upper contacts 296 extend to contact the top surfaces of the terminals 54 of a component 34 under test. Contact station 294 is made of an electrically insulative material such as polyester reinforced with glass fiber that holds upper contacts 296. A right angle substrate-mounting bracket 300 rigidly mounted to X-axis positioning block 280 supports an electrically insulative substrate 302 on which two spaced-apart lower contacts 304 are placed to contact the bottom surfaces of the terminals of a component 34 under test. Thus, manual movement of positioning blocks 278 and 280 aligns contact station 294 in proper position with test plate 40 to ensure electrically contact with components 34 carried in pockets 42. X-axis positioning block 280 moves contact station 94 radially with respect to test plate 40, and Y-axis positioning block 278 moves contact station 294 tangentially with respect to the periphery of test plate 40.

With particular reference to FIG. 10, test head 124 operates as follows. Before automated testing begins, an operator manually positions test head 124 by adjusting the X-axis and Y-axis positioning knobs so that lower contacts 304 will slidingly engage the undersides of the terminals of component 34 under test as test plate 40 rotates to index a pocket 42 in alignment for testing. The controller activates solenoid 292 to cause plunger 290 to retract and thereby pivotally move contact station 294 upward to lift upper contacts 296 away from test plate 40 as it rotates to present a component 34 for testing. A photodiode light emitter 310 and detector 312 positioned on either side of yoke 284 detect between them an unbroken light beam path that indicates rocker arm 286 has been pivotally moved upward before the controller indexes test plate 40. Once a pocket 42 of test plate 40 is indexed into place, the controller deactivates solenoid 292 to cause plunger 290 to extend and thereby pivotally move contact station 294 downward to place upper contacts 296 onto terminals 54 of component 34 for testing. A rubber bumper 314 supported on X-axis positioning block 280 and extending through yoke 284 provides a noise dampener for rocker arm 286.

The positioning of a component 34 so that upper contacts 296 and lower contacts 304 touch the portions of terminals 54 coated on the ends of the long dimension of component 34 enables four-terminal testing by test measurement instrument 110. For example, four-terminal testing for electrical resistance is typically a two-step process. The first step measures the contact resistance of the terminal coatings 54 and entails applying to each terminal coating 54 an electrical signal across the upper contact 296 and lower contact 304 touching the terminal coating 54. The second step measures the total resistance of the component 34 and entails applying across its terminal coatings 54 an electrical signal to the upper contact 296 and. lower contact 304 pair positioned at terminal coatings 54 at either end of component 34. The resistance of the body of component 34 would be the difference of the two resistance values measured. A suitable test measurement instrument 110 would be one of Hewlett Packard Models 4278A, 4284A, and 4286A Precision LCR Meters, the model numbers differentiating the measurement signal frequency ranges.

Figure 1C:
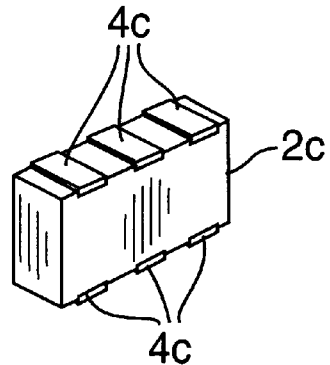
Figure 1D:
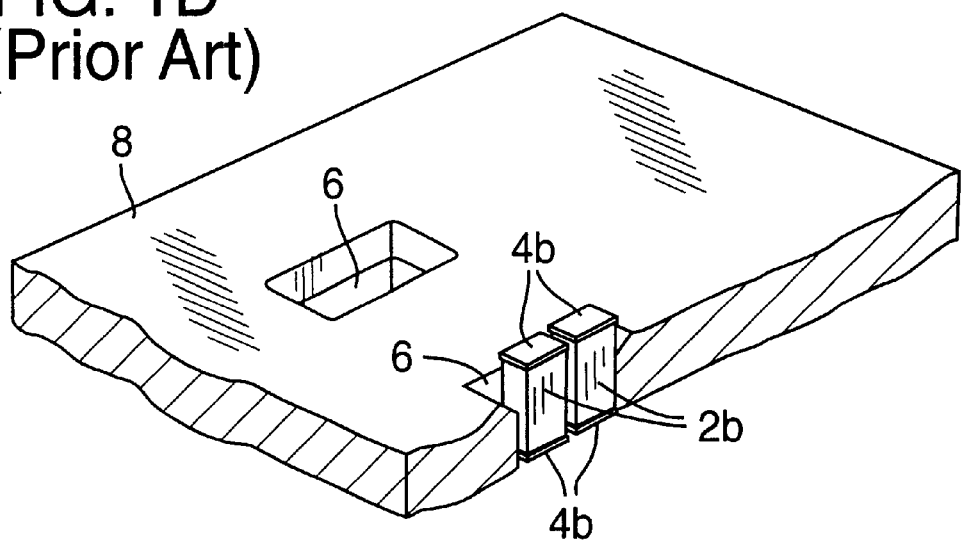
FIG. 1D shows two incorrectly loaded short-side terminated components standing side-by-side in one test plate slot.
Figure 2A:
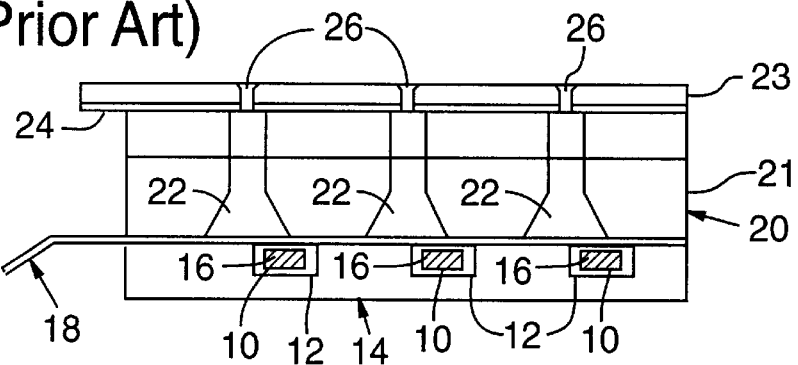
FIGS. 2A, 2B, and 2C illustrate a prior art method of loading and electrically testing long-side terminated electronic components.
Figure 2B:
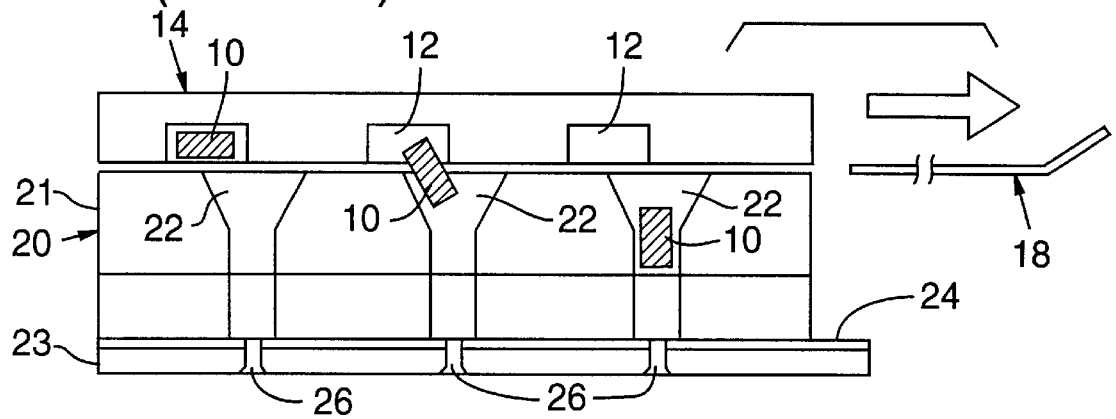
Figure 2C:
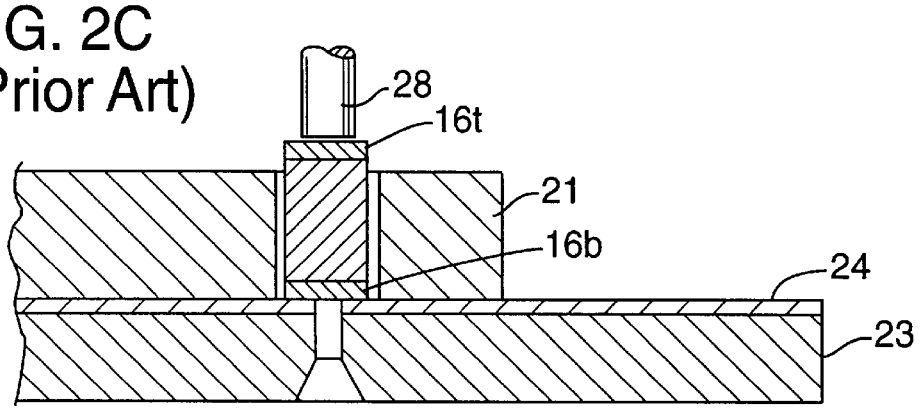

Skilled persons will appreciate that the probe access rotary tester 100 provides to the upper and lower surfaces of the long dimension of components 34 would be especially advantageous in testing chip array components of the type shown in FIG. 1C.

Figure 12:
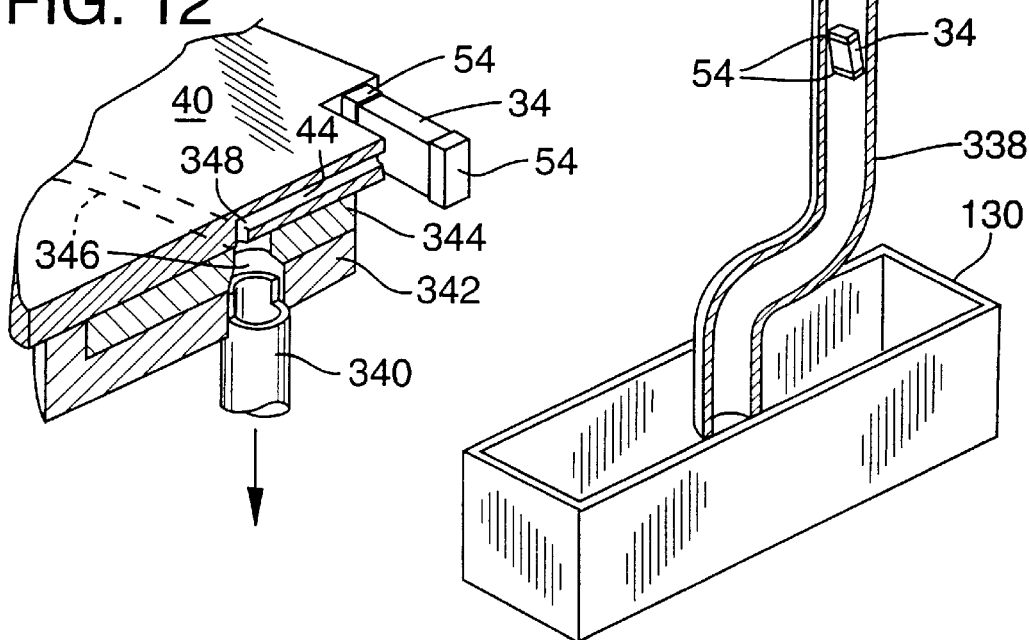
FIG. 12 is an enlarged fragmentary isometric view of the flow path of the vacuum pressure that holds components in the pockets of test plate 40 of FIG. 11.

Rotary tester 100 is equipped with blow off manifold 128 to enable sorting the tested components 34 according to the degree to which an electrical parameter varies from a desired value. FIGS. 11 and 12 show the manner in which components 34 are sorted after testing and the flow paths of vacuum and ejection pressures that, respectively, hold components 34 in and eject components 34 from pockets 42 of test plate 40. With particular reference to FIGS. 11 and 12, air fittings 254 are supported on blow off nozzle bar 258 downstream from test heads 124 and 126 (in the direction of rotation 48 of rotatable assembly 120). The spacing between adjacent air fittings 254 is the same as the spacing between adjacent pockets 42. Air fittings 254 are arranged to register with binning outlets 332 in blow off manifold 128. In a typical form of the rotary tester 100 described, 125 pockets 42 are provided about the circumference of test plate 40, in registry with 125 vacuum pressure passageways 44.

Each air fitting 254 communicates through a flexible air tube 256 and a solenoid valve (not shown) with a source of pressurized air (not shown). Thus, when the solenoid valve is activated, a puff of air is emitted from fitting 254 and through an eject opening 334 in a channel 336 within blow off nozzle bar 258 to overcome the vacuum pressure holding component 34 in pocket 42 and thereby eject the tested component 34 from pocket 42.

Vacuum pressure is delivered to vacuum passageways 44 in test plate 40 from a source of vacuum pressure (not shown). A vacuum supply tube 340 connected to the vacuum pressure source terminates in an aperture through an annular mounting plate 342 that is supported by circular base plate 156 (FIG. 7) and that supports a stationary annular vacuum ring 344. Vacuum ring 344 has a continuous annular groove 346 that test plate 40 covers to form a closed vacuum delivery channel to an inlet port 348 for each passageway 44 in test plate 340. Annular groove 346 and inlet ports 348 have the same radii measured from axis 214; therefore, vacuum pressure is continuously supplied to passageways 44 as test plate 40 slides on the top surface of vacuum ring 344 as test plate 40 rotates in direction 48.

Also registering with each air fitting 254, but on the underside of blow off manifold 128, is the inlet end of a component discharge tube 338. The outlet end of tube 336 registers with collection bin 130 supported on a portion of top surface 106 of test stand 102. Thus, all components tested to be within the same magnitude range of an electrical property are collected in the same collection bin 130. All of collection bins 130 are retained together as a group. Although the illustrated embodiment provides five air nozzles and collection receptacles, it will be appreciated that any desired number may be provided.

The operation of automated rotary tester 100 described herein is preferably locally controlled by means of the microprocessor-based controller housed in electronics enclosure 104. In the automatic operation of the apparatus, an operator sets the electrical parameters on the test measurement instrument, fills the infeed station with components 34 to be tested, and turns on a main power switch. The controller operates first to activate solenoids 292 to retract plungers 290 and thereby lift contact station 294 from test plate 40. This retracting motion is stopped upon a signal from photoelectric control unit 230, indicating that contact stations 294 are in a fully raised position.

The controller then activates stepper motor 122 to rotate load plate 30, chute plate 36, and test plate 40 in clockwise direction 48. Rotation continues until a signal from the photoelectric control unit detector 234 indicates that two pockets 40 are aligned with heads 124 and 126. The controller then activates solenoids 292 to lower the pair of upper contacts 294 of test heads 124 and 126 into electrical contact with the respective terminals 54 of components 34.

With test heads 124 and 126 extended into electrical contact with terminals 54, the controller delivers a signal to test instrument 110 that the two components 34 presented are ready for testing. Rotatable assembly 120 remains motionless until a signal is received by the controller from test instrument 110 that the test is completed. The controller then activates solenoids 292 to retract plungers 290 and thereby lift contact stations 294 from test plate 40. Assuming that the probe retraction is completed, the controller activates stepper motor 122 to index rotatable assembly 120 clockwise to the next test position, whereupon the foregoing procedure is repeated.

The tested components 34 move stepwise with test plate 40 until they register with air fittings 254 of the sorting mechanism. The controller functions to remember the test results on the particular components 34 and activates the appropriate air solenoids to eject components 34 into the collection bins 130.

It has been determined that with the above-described rotary tester 100 employing a test plate 40 having 125 pockets about its circumference, the testing and sorting operation is capable of processing in excess of 20,000 miniature electronic components per hour, fully automatically and without the attendance of an operator.

While the present invention has been described in terms of specific embodiments, it will be apparent to one of skill in the art that the invention is susceptible to additional embodiments and certain of the details described herein may be varied considerably without departing from the basic principles of the invention. For example, the load plate, chute plate, and test plate may be rectangular in shape, with the load plate slots, chutes and test plate pockets being arranged in a matrix or rectangular array. Such an arrangement of plates could be usefully employed for automatic loading in batch processing operations. Similarly, while the present invention has been described in conjunction with a device for testing and sorting components, the apparatus and methods of the present invention could be usefully employed in other operations, such as terminating electronic components. Moreover, the invention is useful for orienting and processing elongate components that are not terminated. The scope of the invention should, therefore, be determined only by the following claims.

I claim:

1. Apparatus for loading and positioning multiple elongate components, each of which having unequal length and width dimensions that define a short axis and a long axis of the component, the apparatus comprising:

a load plate having at least one slot extending therethrough, the slot having two opposing sidewalls and being sized to receive and hold the component with its long axis in an orientation transverse to an upper surface of the load plate;

a guide element delivering the component to the slot;

at least one curved chute, the chute being positioned immediately below and in communication with the slot, the chute bending from an upper opening to a medial point and flaring outwardly from the medial point to a lower opening, the chute having a width at the medial point larger than the short axis of the component and a width at the lower opening slightly larger than the long axis of the component so that the component is rotated through an angle of about 90° during passage through the chute;

a test plate having upper and lower surfaces and at least one pocket, the pocket being positionable immediately below and in communication with the curved chute, and being shaped to receive and hold the component with its long axis generally parallel to the upper and lower surfaces of the test plate; and a drive mechanism for imparting synchronous motion to the load plate, the curved chute, and the test plate in response to an applied motive force.

2. The apparatus of claim 1, in which the chute is formed in a chute plate positioned immediately below and parallel to the load plate.

3. The apparatus of claim 2, additionally comprising a stationary film plate positioned between the load plate and the chute plate for retaining the component in the slot during alignment of the load plate, chute plate, and test plate.

4. The apparatus of claim 1 in which the component has opposite sides that extend along the long axis and in which the pocket extends through the test plate from the upper surface to the lower surface so that the component is retained in the pocket with a lower long axis side of the component exposed from the lower surface of the test plate.

5. The apparatus of claim 4, in which the test plate additionally comprises at least one vacuum passageway that is in communication with the pocket for application of vacuum pressure for retaining the component in the pocket.

6. Apparatus for loading and positioning multiple elongate components, each of which having unequal length and width dimensions that define a short axis and a long axis corresponding to respective opposing short axis sides and opposing long axis sides of the component, the apparatus comprising:

a circular load plate having at least one slot positioned on an outer circumference of the load plate and extending therethrough, the slot having two opposing sidewalls and being sized to receive and hold the component with its long axis in an orientation transverse to an upper surface of the load plate;

a guide element delivering the component to the slot;

at least one curved chute, the chute being positioned immediately below and in communication with the slot, the chute additionally bending from an upper opening to a medial point and flaring outwardly from the medial point to a lower opening, the chute having a width at the medial point larger than the short axis of the component and a width at the lower opening larger than the long axis of the component so that the component is rotated through an angle of about 90° during passage through the chute;

a circular test plate having upper and lower surfaces and at least one pocket positioned on an outer circumference of the chute plate, the pocket being positionable immediately below and in communication with the curved chute, and being shaped to receive and hold the component with its long axis generally parallel to the upper and lower surfaces of the test plate; and a drive mechanism for imparting synchronous motion to the load plate, the curved chute, and the test plate in response to an applied motive force;

whereby, upon exiting the chute, the component is received and retained in the pocket with an upper long axis side of the component exposed from one of the surfaces of the test plate.

7. The apparatus of claim 6, in which the pocket extends through the test plate from the upper surface to the lower surface so that the component is retained in the pocket with a lower long axis side of the component exposed from the lower surface of the test plate.

8. The apparatus of claim 7, in which the test plate additionally comprises at least one vacuum passageway that is in communication with the pocket for application of vacuum pressure for retaining the component in the pocket.

9. The apparatus of claim 6, in which the chute is formed in an outer circumference of a circular chute plate positioned immediately below and parallel to the load plate.

10. The apparatus of claim 9, in which the drive mechanism rotates the load plate, chute plate, and test plate in the same direction and at the same speed, the test plate being angled away from the load plate and the chute plate to provide access to the component on the upper surface of the test plate following retention of the component in the pocket.

11. The apparatus of claim 9, additionally comprising a stationary film plate positioned between the load plate and the chute plate for retaining the component in the slot during alignment of the load plate, chute plate, and test plate.

12. A method for loading and positioning multiple elongate components, each of which having unequal length and width dimensions that define a short axis and a long axis corresponding to respective opposing short axis sides and opposing long axis sides of the component, the method comprising:

providing a load plate having at least one slot extending therethrough, the slot having two opposing sidewalls and being sized to receive and hold the component with its long axis in an orientation transverse to an upper surface of the load plate;

delivering the component to the slot;

placing and retaining the component in the slot with long axis sides of the component facing the sidewalls;

positioning a curved chute immediately below and in communication with the slot, the chute bending from an upper opening to a medial point and flaring outwardly from the medial point to a lower opening, the chute having a width at the medial point larger than the short axis of the component and a width it the lower opening larger than the long axis of the component so that the component is rotated through an angle of about 90° during passage through the chute;

providing a test plate having upper and lower surfaces and at least one pocket, the pocket being, positionable immediately below and in communication with the curved chute, and being shaped to receive and hold the component;

imparting motion to the load plate, curved chute, and test plate to cause the component to drop out of the slot of the load plate, pass through the curved chute, and drop into the pocket of the test plate; and retaining the component in the pocket with the long axis of the component generally parallel to the upper and lower surfaces of the test plate and an upper long axis side of the component exposed from the upper surface of the test plate.

13. The method of claim 12, in which the chute is formed in a chute plate and the method additionally comprises positioning the chute plate immediately below and parallel to the load plate.

14. The method of claim 13, additionally comprising positioning a stationary film plate between the load plate and the chute plate to retain the component in the slot during alignment of the load plate, chute plate and test plate.

15. The method of claim 12, in which the pocket extends through the test plate from the upper surface to the lower surface so that the component is retained in the pocket with a lower long axis side of the component exposed from the lower surface of the test plate.

16. The method of claim 15, in which the component is retained in the pocket by means of vacuum pressure.

17. A method for loading and positioning multiple elongate components, each of which having unequal length and width dimensions that define a short axis and a long axis corresponding to respective opposing short axis sides and opposing long axis sides of the component, the method comprising:

providing a circular load plate having at least one slot positioned on an outer circumference of the load plate and extending therethrough, the slot having two opposing sidewalls and being sized to receive and hold the component with its long axis in an orientation transverse to an upper surface of the load plate;

delivering the component to the slot;

placing and retaining the component in the slot with the long axis sides of the component facing the sidewalls;

positioning a cursed chute immediately below and in communication with the slot, the chute bending from an upper opening to a medial point and flaring outwardly from the medial point to a lower opening, the chute having a width at the medial point larger than the short axis of the component and a width at the lower opening larger than the long axis of the component so that the component is rotated through an angle of about 90° during passage through the chute;

providing a circular test plate having upper and a lower surfaces and at least one pocket positioned on an outer circumference of the chute plate, the pocket being positionable immediately below and in communication with the curved chute, and being shaped to receive and hold the component;

imparting rotary motion to the load plate, curved chute, and test plate to cause the component to drop out of the slot of the load plate, pass through the curved chute, and drop into the pocket of the test plate; and retaining the component in the pocket with the long axis of the component generally parallel to the upper and lower surfaces of the test plate and an upper long axis side of the component exposed from the upper surface of the test plate.

18. The method of claim 17, in which the pocket extends through the test plate from the upper surface to the lower surface so that the component is retained in the pocket with a lower long axis side of the component exposed from the lower surface of the test plate.

19. The method of claim 18, in which the component is retained in the pocket by means of vacuum pressure.

20. The method of claim 17, in which the chute is formed in an outer circumference of a circular chute plate and the method additionally comprises positioning the chute plate immediately below and parallel to the load plate.

21. The method of claim 20, in which the rotary motion imparted to the load plate, chute plate, and test plate rotates them in the same direction and at the same speed, the test plate being angled away from the load plate and the chute plate to provide access to the component from the upper surface of the test plate following retention of the component in the pocket.

22. The method of claim 20, additionally comprising positioning a stationary film plate between the load plate and the chute plate for retaining the component in the slot during alignment of the load plate, chute plate, and test plate.

* * * * *

UNITED STATES PATENT AND TRADEMARK OFFICE
CERTIFICATE OF CORRECTION

PATENT NO. : 5,984,079
DATED : November 16, 1999
INVENTOR(S) : Douglas J. Garcia It is certified that error appears in the above-identified patent and that said Letters Patent is hereby corrected as shown below:

Column 1,
Line 5, "and is positioning" should read -- and positioning --.

Column 3,
Line 36, "an is intergral" should read -- an intergral --.

Column 5,
Line 47, "to he lower" should read -- to the lower --.

Column 6,
Line 31, "Sufficient" should read -- sufficient --.
Line 43, "Between" should read -- between --.

Column 7,
Line 55, "Et" should read -- a --.
Line 62, "4S" should read -- is --.

Column 8,
Line 17, "position" should read -- positioned --.
Line 22, "158." should read -- 158, --.

Column 8,
Line 31, "138" should read -- 108 --.
Line 36, "packets" should read -- pockets --.

Column 9,
Line 6, "4L2" should read -- 42 --.
Line 16, "pocKets" should read -- pockets --.
Line 51, "p:n" should read -- pin --.

UNITED STATES PATENT AND TRADEMARK OFFICE
CERTIFICATE OF CORRECTION

PATENT NO.   : 5,984,079
DATED        : November 16, 1999
INVENTOR(S)  : Douglas J. Garcia It is certified that error appears in the above-identified patent and that said Letters Patent is hereby corrected as shown below:

Column 10,
Line 38, "and." should read -- and --.

Claim 12, column 14,
Line 23, "width it the" should read -- width at the --.
Line 27, "being," should read -- being --.

Claim 17, column 15,
Line 4, "cursed" should read -- curved --.

Signed and Sealed this

Eleventh Day of September, 2001

*Attest:*

NICHOLAS P. GODICI
*Attesting Officer*   Acting Director of the United States Patent and Trademark Office